(12) United States Patent
Adusumilli et al.

(10) Patent No.: US 9,881,798 B1
(45) Date of Patent: Jan. 30, 2018

(54) METAL CAP INTEGRATION BY LOCAL ALLOYING

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/215,544

(22) Filed: Jul. 20, 2016

(51) Int. Cl.
| | |
|---|---|
| *H01L 21/283* | (2006.01) |
| *H01L 23/528* | (2006.01) |
| *H01L 23/532* | (2006.01) |
| *H01L 21/768* | (2006.01) |
| *H01L 21/02* | (2006.01) |
| *H01L 23/48* | (2006.01) |
| *H01L 21/28* | (2006.01) |
| *H01L 23/522* | (2006.01) |

(52) U.S. Cl.
CPC ...... *H01L 21/283* (2013.01); *H01L 21/02697* (2013.01); *H01L 21/28* (2013.01); *H01L 21/76843* (2013.01); *H01L 21/76864* (2013.01); *H01L 21/76865* (2013.01); *H01L 23/48* (2013.01); *H01L 23/481* (2013.01); *H01L 23/528* (2013.01); *H01L 23/5226* (2013.01); *H01L 23/53204* (2013.01); *H01L 23/53209* (2013.01); *H01L 23/53228* (2013.01); *H01L 23/53238* (2013.01); *H01L 23/53266* (2013.01)

(58) Field of Classification Search
CPC . H01L 21/02697; H01L 21/28; H01L 21/283; H01L 21/44; H01L 23/48; H01L 23/481; H01L 23/482; H01L 23/50; H01L 23/52; H01L 23/522; H01L 23/5226; H01L 23/528; H01L 23/5283; H01L 23/532; H01L 23/53204; H01L 23/53209; H01L 23/53228; H01L 23/53233; H01L 23/53238
See application file for complete search history.

(56) References Cited

U.S. PATENT DOCUMENTS

| | | | |
|---|---|---|---|
| 6,147,000 A | * | 11/2000 | You ............... H01L 21/76849 257/E21.584 |
| 6,383,929 B1 | | 5/2002 | Boettcher et al. |
| 7,843,063 B2 | | 11/2010 | Baker-O'Neal et al. |
| 7,846,841 B2 | | 12/2010 | Ishizaka et al. |
| 8,008,199 B2 | | 8/2011 | Baker-O'Neal et al. |

(Continued)

FOREIGN PATENT DOCUMENTS

CN          103794545          5/2014

*Primary Examiner* — Eduardo A Rodela
(74) *Attorney, Agent, or Firm* — Daniel P. Morris, Esq.; Otterstedt, Ellenbogen & Kammer, LLP

(57) ABSTRACT

A middle-of-line interconnect structure including copper interconnects and integral copper alloy caps provides effective electromigration resistance. A metal cap layer is deposited on the top surfaces of the interconnects. A post-deposition anneal causes formation of the copper alloy caps from the interconnects and the metal cap layer. Selective removal of unalloyed metal cap layer material provides an interconnect structure free of metal residue on the dielectric material layer separating the interconnects.

12 Claims, 7 Drawing Sheets

(56) References Cited

U.S. PATENT DOCUMENTS

| | | | |
|---|---|---|---|
| 8,211,800 B2 | 7/2012 | Uozumi | |
| 8,569,165 B2 | 10/2013 | Gordon et al. | |
| 8,592,312 B2 | 11/2013 | Ryan et al. | |
| 8,796,853 B2 * | 8/2014 | Yang | H01L 23/53223 257/751 |
| 9,425,092 B2 * | 8/2016 | Emesh | H01L 21/76879 |
| 2001/0018273 A1 * | 8/2001 | Park | H01L 21/318 438/762 |
| 2002/0074664 A1 | 6/2002 | Nogami et al. | |
| 2010/0055903 A1 * | 3/2010 | Werner | H01L 21/02164 438/675 |
| 2014/0045331 A1 | 2/2014 | Gordon et al. | |

\* cited by examiner

METAL CAP INTEGRATION BY LOCAL ALLOYING

BACKGROUND

The present disclosure relates generally to the electrical, electronic and computer arts and, more particularly, to metal cap integration on interconnect structures.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

Silicon-based devices typically include multiple interconnect metallization layers above a device (front-end-of-line/ FEOL) layer that contains field-effect transistors (FETs), memory devices, or other structures. Middle-of-line (MOL) processing includes steps typically used for fabricating metal contacts for logic circuitry components such as field-effect transistors (FETs), resistors, diodes, and capacitors. Interlayer dielectric (ILD) is used to electrically separate closely spaced interconnect lines. Lower-k interlayer dielectrics are associated with lower power consumption and reduced cross-talk. Back-end-of-line (BEOL) processing involves the creation of metal interconnecting wires that connect the devices formed in FEOL processing to form electrical circuits. The wires are electrically isolated by dielectric layers.

A thin barrier layer (not shown), which is typically about 25-75 nm thick and which comprises, for example, silicon nitride, is deposited over the FEOL layer (not shown). This is followed by deposition of one or more dielectric layers and one or more cap layers, forming a MOL dielectric layer 22 as shown in FIG. 8. The MOL dielectric layer 22, including the cap layer(s), may contain any suitable dielectric material(s) including but not limited to: silicon dioxide, silicon nitride, silicon oxynitride, boron doped phosphorus silicate glass (BPSG), and phosphosilicate glass (PSG). In some embodiments, the MOL dielectric layer(s) and the cap layer(s) contain BPSG or undoped low temperature oxide that is formed by any suitable dielectric deposition processes, including, but not limited to: high density plasma deposition (HDP) or plasma-enhanced chemical vapor deposition (PECVD). The MOL dielectric/cap layer(s) typically function to act as barriers between the transistors in the FEOL layer and metal layers to be deposited subsequently, so as to prevent migration of the metal species into active regions of the transistors and to protect the transistors against potential metal contamination. The layer may also function as a mask for forming deep trenches in the semiconductor substrate of the FEOL layer for subsequent fabrication of the trench capacitors. The MOL dielectric layer 22 may have a thickness ranging from about 5000 Å to about 7000 Å or greater, depending on the specific application requirements to provide a dielectric cover for the transistors or other logic circuitry components comprising the FEOL layer during and metal contact fabrication process.

Trench openings are conventionally formed in the MOL dielectric layer 22 by using photolithography and etching steps. Specifically, a photoresist (not shown) is applied over the MOL dielectric layer 22. The photoresist can be applied by any suitable technique, including, but not limited to coating or spin-on techniques. A mask (not shown), which is patterned with shapes defining trench openings (and possibly contact holes) to be formed, is provided over the photoresist, and the mask pattern is transferred to the photoresist using a photolithographic process, which creates recesses in the uncovered regions of the photoresist. The patterned photoresist is subsequently used to create the same pattern of recesses in the MOL dielectric layer through conventional etching typically used for forming trenches and contact holes. The etching selectively removes a portion of the MOL dielectric layer and stops above the FEOL layer. The depth of the trench openings can be controlled by using a timed etching process. Alternatively, the dielectric layer may include multiple layers that may be selectively etched. In such a case, the etch process selectively removes the upper layer(s) of the MOL dielectric layer 22, stopping at a lower layer thereof that adjoins the FEOL layer and forms an etch stop. After formation of the trench openings, the photoresist may be stripped by ashing or other suitable process from the MOL dielectric layer 22.

A barrier layer 26 is conformally deposited on the structure, thereby lining the trenches formed within the dielectric layer 22. The barrier layer is formed from a work function setting material such as titanium nitride, TaN or WN. A metal interconnect layer 28 is deposited on the barrier layer 26 using, for example, chemical vapor deposition. The structure is planarized using a process such as chemical mechanical planarization (CMP). Referring again to FIG. 8, a metal cap layer 30 is selectively deposited on the metal interconnect layer 28 within the trenches. For example, metals such as cobalt, ruthenium or manganese may be deposited using chemical vapor deposition or atomic layer deposition to form the cap layers. The selectivity of metal cap deposition can be problematic and result in metal residue 30A. Post-deposition cleaning is accordingly required to ensure there is no leakage or degradation resulting from the possible metal residues on a structure 20 as shown in FIG. 8.

In an alternative prior art approach, a structure 40 as shown in FIG. 9A is obtained using some of the techniques described above. The structure 40 includes a trench 44 within a MOL dielectric layer 42. The trench 44 contains a copper interconnect 46 formed on a barrier layer. A low-k, silicon carbide-based film 47, such as a barrier low-k (BLOk) film, is compatible with the copper damascene process and can function as a barrier/etch stop layer. The copper interconnect 46 is then recessed as shown in FIG. 9B so that the exposed top surface thereof is beneath the plane of the silicon carbide film 48 and underlying MOL dielectric layer 42. As shown in FIG. 9C, a self-aligned deposition of a metal cap layer 49 of, for example, ruthenium (Ru) seals the top surface of the structure, including the copper interconnect 46. The structure is subjected to further chemical mechanical planarization down to the top surface of the silicon carbide film 47, as shown in FIG. 9D. The metal cap layer 49 thereby protects the interconnect structure from, for example, downstream etch processes and provides electrically conductive surfaces on the MOL dielectric layer.

BRIEF SUMMARY

Techniques are provided for forming a residue-less interconnect metallization structure including a copper/copper alloy interface.

In one aspect, an exemplary fabrication method includes obtaining a structure including a dielectric layer having a top surface, a plurality of open-ended trenches extending within the dielectric layer, and interconnects comprising copper within the trenches. The interconnects have top surfaces that are substantially coplanar with the top surface of the dielectric layer. A metal cap layer is deposited on the structure such that the cap layer directly contacts the top surfaces of the interconnects at a plurality of interfaces, the cap layer comprising at least one of titanium, ruthenium and cobalt. The method further includes subjecting the structure to thermal annealing to form metal alloy caps comprising copper and at least one of titanium, ruthenium and cobalt at the interfaces from the interconnects and a portion of the cap layer while a residual portion of the cap layer remains non-alloyed. The non-alloyed residual portion of the cap layer is selectively removed from the structure.

In another aspect, an interconnect structure is provided that includes a dielectric layer having a top surface, a plurality of open-ended trenches extending within the dielectric layer, interconnects comprising copper within the trenches, the interconnects having top surfaces that are substantially coplanar with the top surface of the dielectric layer, and a plurality of metal alloy caps for preventing electromigration. Each of the alloy caps is integral with one of the interconnects and comprises an alloy of copper and at least one of titanium, ruthenium and cobalt.

Techniques as disclosed herein can provide substantial beneficial technical effects. By way of example only and without limitation, one or more embodiments may provide one or more of the following advantages:

Good copper/metal interface adhesion;
Compatibility with existing metal deposition processes;
Absence of residues of the metal capping layer on the resulting structure;
Good electromigration resistance.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
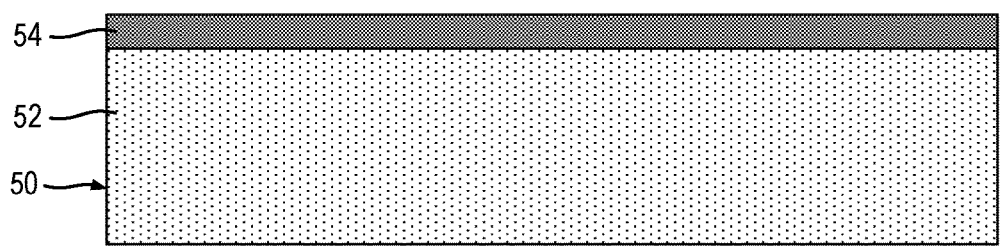
FIG. 1 is a schematic, cross-sectional view of an interconnect layer including a low-k dielectric layer and surface dielectric layer thereon.
Figure 7:
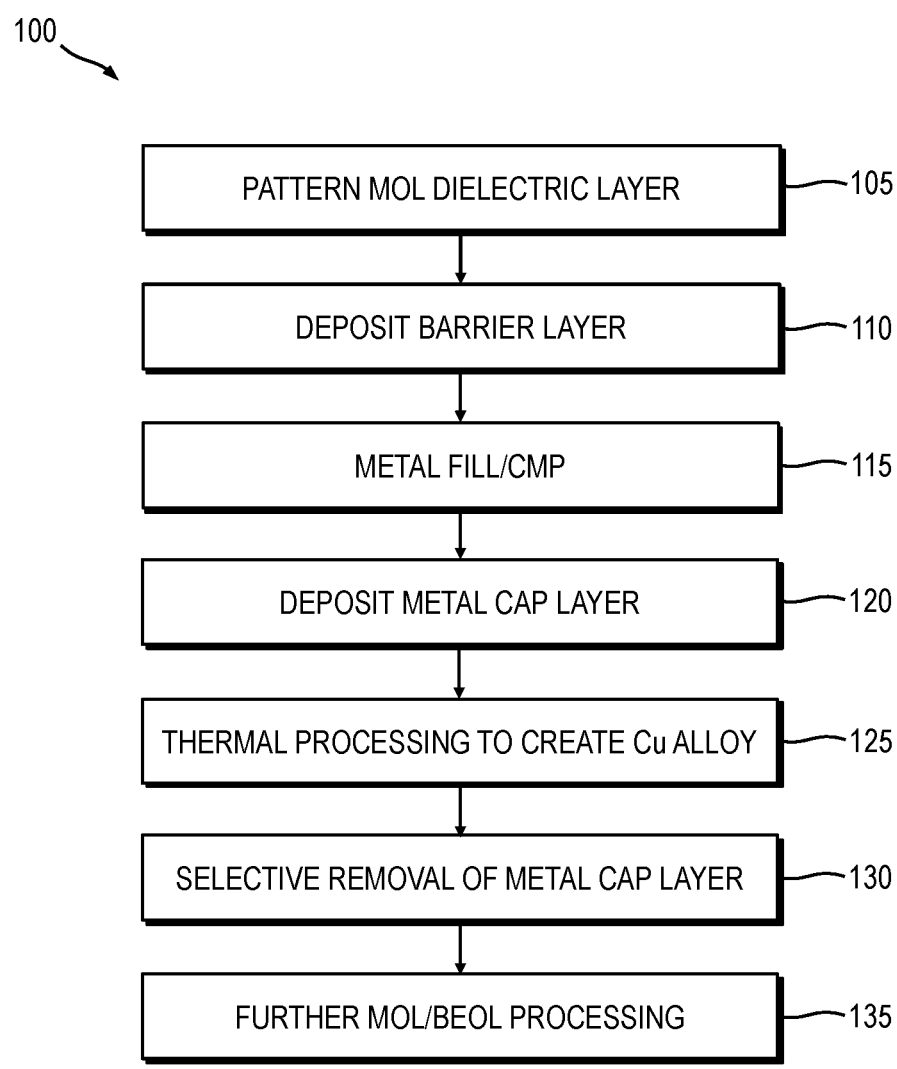
FIG. 7 is a flow diagram showing metal cap integration by forming a local alloy layer.
Figure 8:
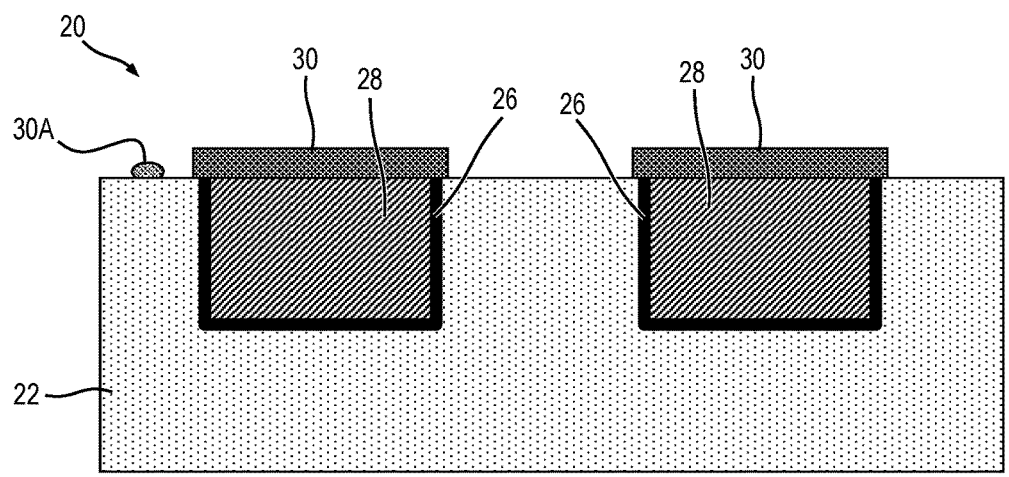
FIG. 8 is a schematic, cross-sectional view of a prior art structure including an interconnect layer having a selectively deposited metal cap thereon.
Figure 9A:
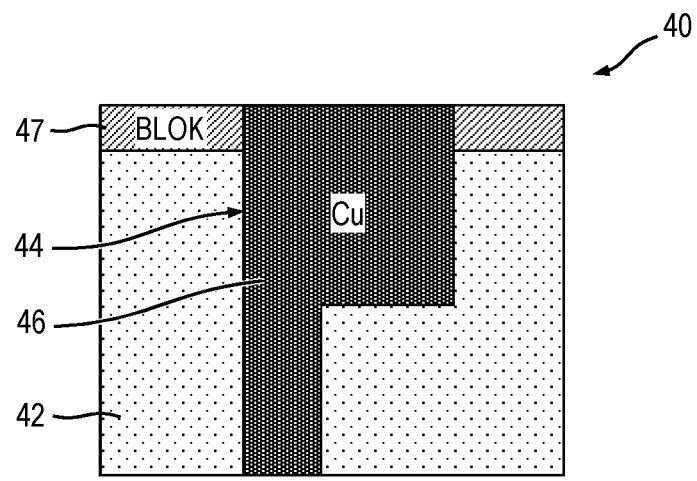
FIGS. 9A-9D are flow diagrams showing a conventional process for forming a metal cap layer on a recessed copper interconnect layer.
Figure 9B:
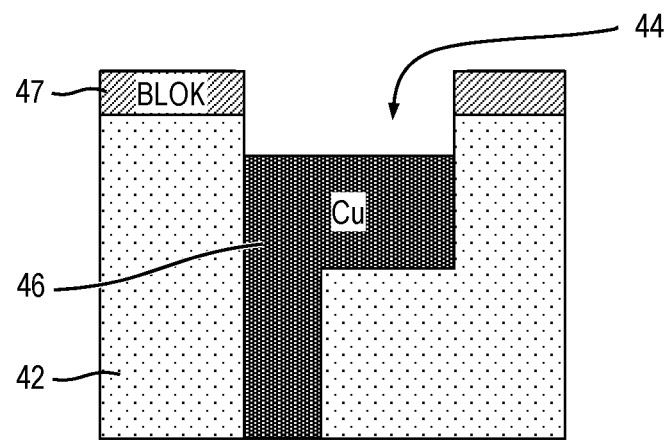
Figure 9C:
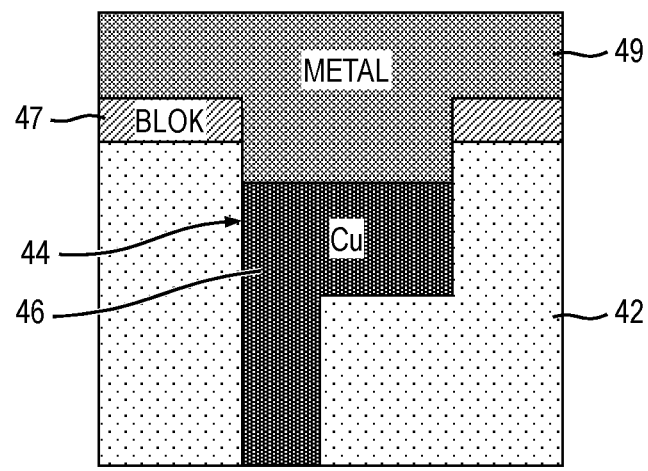
Figure 9D:
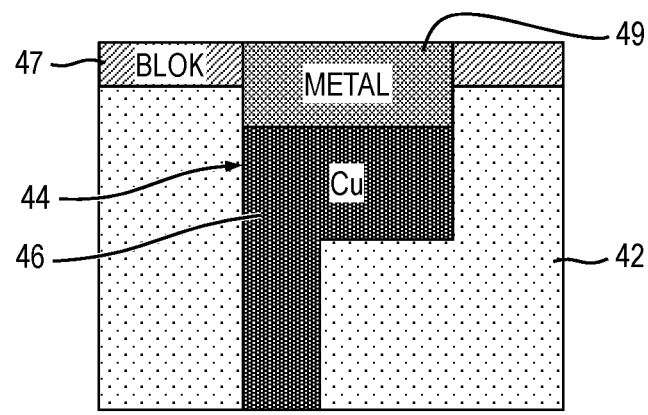

An exemplary process flow 100 is provided in FIG. 7, starting with a structure 50 as shown in FIG. 1. The structure 50 including a low-k dielectric layer 52 and a sacrificial dielectric layer 54 on the surface of the low-k layer. Low-k dielectric materials are understood as having a dielectric constant that is less than the dielectric constant of silicon oxide of 3.9. The low-k dielectric layer has a dielectric constant of three or less in the exemplary embodiments, and are preferably less than three. The low-k dielectric material may be deposited on a FEOL layer or another layer by methods well known in the art. As employed herein, the low-k dielectric layer 52 functions as an MOL layer. SiLK® thermosetting polymer may, for example, be applied by spin coating and is planarized following curing. Chemical vapor deposition (CVD), including plasma-enhanced CVD, is a further technique often used for the deposition of low-k dielectric materials such as porous siliconoxycarbonitride (SiOCN). Low-k organic polymers having dielectric constants below 2.5 may alternatively be employed to form the dielectric layer 52. Low-k ILDs are known to the art for use with copper interconnects. The process disclosed herein may alternatively include ILD material having a dielectric constant that is greater than 2.5 for some nodes. The chosen dielectric material is resistant to subsequent selective etching of cap metal, as described below. The sacrificial dielectric layer 54 is a silicon dioxide ($SiO_2$) layer in one exemplary embodiment.

Figure 2:
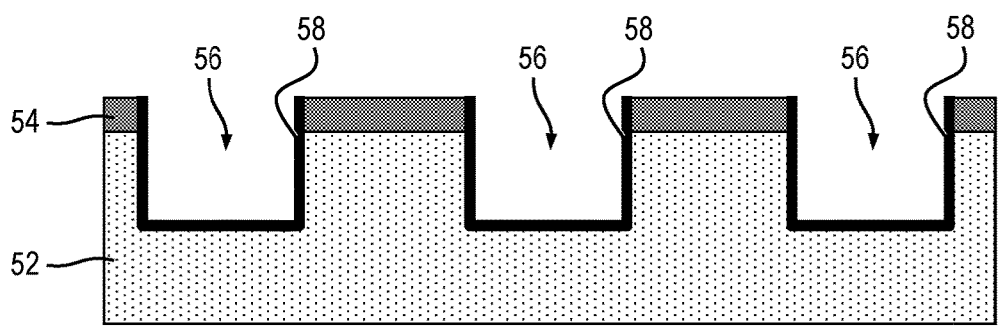
FIG. 2 is a schematic, cross-sectional view thereof following patterning of the layer shown in FIG. 1.

The structure 50 is patterned in step 105 to obtain open trenches 56 as shown in FIG. 2. Conventional lithography and etching processes may be employed to pattern the structure, it being appreciated that such processes continue to be developed in the industry and that processes developed in the future may have application to the techniques disclosed herein. A barrier layer 58 is deposited on the structure in step 110. Titanium nitride (TiN), tungsten nitride (WN) and tantalum nitride (TaN) are among the materials that may be employed to form the barrier layer. The barrier layer includes multiple layers in some embodiments. A titanium nitride (TiN) layer may, for example, be deposited on the structure, as shown in FIG. 2. The TiN layer may have a thickness of about ten to forty Angstroms (10-40 Å) and can be deposited using any suitable deposition process, for example, atomic layer deposition or sputtering. The titanium nitride layer forms a liner on the surfaces within the trenches. In some embodiments, a bilayer metal liner is deposited on the structure. For example, a titanium layer may be conformally deposited on the structure, lining the surfaces of the trenches. The thickness of the titanium layer is between 30-80 Å in some embodiments. Radio frequency enhanced physical vapor deposition (RF PVD) is a known technique for depositing thin metal films, and may be employed for depositing the titanium layer. The TiN layer is then deposited on the titanium layer to form the barrier layer 58. Bilayer liners including TiN and tungsten nitride (WN) may be employed in other alternative embodiments. A conformal layer of tungsten nitride can be deposited using atomic layer deposition (ALD).

A metal interconnect layer is deposited on the structure in step 120 and directly contacts the barrier layer 58. The interconnect layer 60 includes copper (Cu), and consists essentially of elemental copper in some embodiments. Copper alloys such as Cu(Al) may alternatively be employed as metal interconnect layer material. Copper may be deposited using, for example, chemical vapor deposition, physical vapor deposition plus reflow, or electrochemical deposition as used in the copper damascene process. The barrier layer 58 (e.g. tantalum-based layer(s)) deposited prior to the copper fill helps prevent the diffusion of copper into the surrounding dielectric material. The copper fills the trenches 56 formed in the low-k dielectric layer. Chemical mechanical polishing (CMP) follows metal deposition to remove overburden and complete the structure shown in FIG. 3 in which the top surfaces of each metal interconnect 60 are substantially coplanar with the top surface of the dielectric layer 52. The metal interconnects are electrically isolated from each other by the portions of the dielectric layer 52 that separates them.

Figure 4:
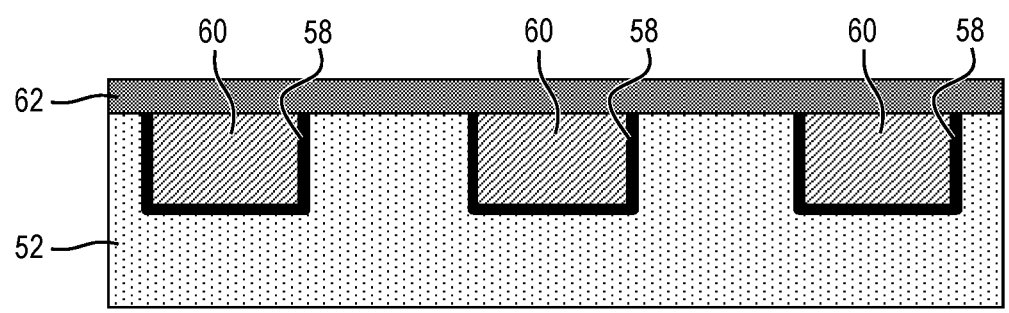
FIG. 4 is a schematic, cross-sectional view thereof following the non-selective deposition of a metal cap layer on the interconnect layer.

A cap layer of a low resistivity material capable of forming an alloy with copper is deposited on the structure as shown in FIG. 4. Exemplary materials include cobalt, ruthenium, and titanium. Cobalt may, for example, be deposited using a metal-organic precursor in a CVD process at a temperature range of 150-200° C. Ruthenium may be deposited using thermal CVD at 1.5 Torr and at a process temperature of 250-350° C. As the deposition of the metal cap layer 62 may be non-selective, any suitable process for forming such a layer on the structure may be employed. Exemplary processes include physical vapor deposition (PVD), chemical vapor deposition (CVD), atomic layer deposition (ALD) and electroless deposition techniques. Deposition times are controlled to obtain a layer 62 of desired thickness. The thickness of the layer 62 is at least sufficient to form an effective copper alloy cap layer on the metal interconnect layer 60 when further processed, as discussed further below. The metal cap layer 62 may include a metal nitride layer to prevent oxidation of the underlying metal. For example, a titanium nitride layer is formed over a titanium layer in some embodiments of the cap layer 62. The ratio of metal to nitrogen in the metal nitride region of the cap layer is one to one (1:1) in some embodiments, though more nitrogen-rich metal nitrides may be employed. Nitrides of cobalt or ruthenium may be employed in alternative embodiments to protect the underlying metal within the cap layer 62. Alloying species are chosen for their selectivity in terms of removal of their nitride by wet etch processes, selective to Cu. For example, in the case of titanium (Ti), TiN can be wet etched without wet etching of Cu.

Figure 5:
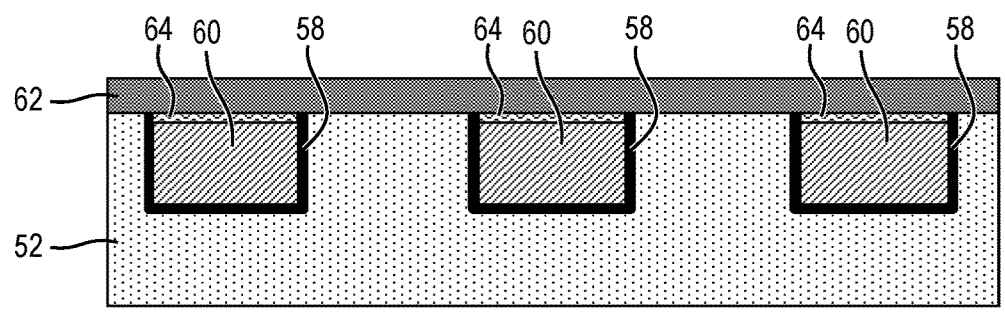
FIG. 5 is a schematic, cross-sectional view thereof following thermal processing to create copper alloy surface layers.

Following deposition of the metal cap layer 62, the structure is subjected to thermal annealing in step 125 to obtain a structure as schematically illustrated in FIG. 5. Annealing time and temperature of the post-deposition anneal is sufficient to create a copper alloy cap layer 64 on the surface of the metal interconnect 60 within each trench. The alloy cap layers are in the range one to ten nanometers in some embodiments. The alloy cap layer is formed to a thickness sufficient to provide effective resistance to electromigration. Cap layers 64 having a thickness of at least three nanometers are formed in some embodiments to ensure such resistance. Annealing temperatures are maintained at 80-400° C. for a sufficient time to form copper alloy cap layers 64 having the desired characteristics. Plasma and thermal annealing processes may be employed in the post-deposition anneal. The annealing process in one or more exemplary embodiments employs a reducing ambient containing Ar/H$_2$ gas, or a nitrogen-based ambient such as Ar/N$_2$ or N$_2$/H$_2$. For higher anneal temperatures (>350° C.), the anneal duration can be reduced. In addition to post-deposition anneal, in-situ annealing during metal cap layer deposition can also be employed. The annealing process can initiate during film deposition, and be continued after the metal cap deposition has been completed (in case of the need for a thicker alloy cap film). For metal alloy cap materials containing Cu and Ti, for example, the alloy should exhibit a 1:1 stoichiometry, or should be Ti-rich in order to effectively assist in reducing electromigration.

Figure 6:
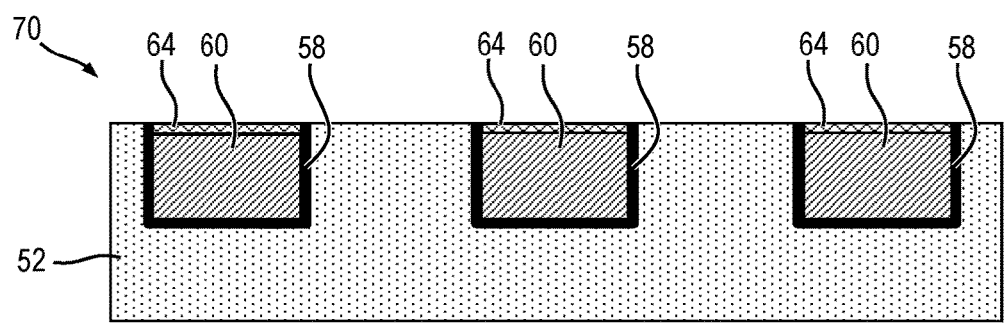
FIG. 6 is a schematic, cross-sectional view thereof following selective removal of the metal cap layer.

The non-alloyed metal layer 62 is selectively removed in step 130 once alloy cap layers of desired thickness and composition have been formed. The structure obtained following step 125 is subjected to a wet etch including a mixture of hydrofluoric and hydrochloric acid to remove the metal layer in some embodiments. Any of several wet etch chemistries, including but not limited to mixtures of HF and HCl (such as for removal of Co) can be employed in this process, preferably at a temperature below one hundred degrees Centigrade (100° C.). These wet chemistries have a very low removal rate of Cu-containing materials in order to avoid dissolution of the copper alloy cap layers and underlying interconnect metal. The selective etch leaves the alloy cap layers 64, the barrier layer, and the low-k dielectric material substantially intact, resulting in an interconnect structure 70 as schematically illustrated in FIG. 6. The structure 70 includes a low-k dielectric layer including plurality of open-ended trenches, each trench containing a barrier layer and an adjoining contact metal layer including copper, and a copper alloy cap layer 64 on each contact metal layer that provides effective resistance to electromigration. The structure is unlikely to contain metal residues between adjacent copper-containing lines, thereby enhancing reliability. No recessing of the metal interconnect 62 within each trench is required to form the structure 70.

Step 135, which may include multiple steps, involves the forming additional layer(s) on the interconnect structure 70 including one or more middle-of-line (MOL) layers, back-end-of-line (BEOL) layers and associated metallization layers. The resulting structure may include one or more electrically connected MOL layers formed in substantially the same manner as the structure 70, all formed above a FEOL layer including CMOS devices.

Interconnect structures as described herein facilitate adoption of scaled down technology nodes. The processes described herein may, if desired, employ currently existing conformal metal deposition and metal etch processes, allowing their implementation within existing facilities using existing tooling. It will be appreciated that new deposition and etch processes having application to the processes discussed herein may be developed and adopted.

FIGS. 1-7, as discussed above, depict exemplary processing steps/stages in the fabrication of exemplary structures. Although the overall fabrication method and the structure formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Figure 3:
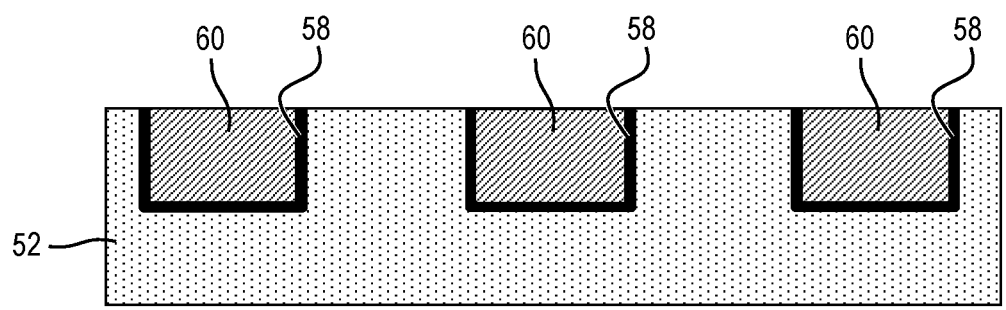
FIG. 3 is a schematic, cross-sectional view thereof following deposition of a barrier layer and a copper-containing layer within open trenches of the interconnect layer.

Given the discussion thus far, it will be appreciated that, in general terms, an exemplary fabrication method includes obtaining a structure including a dielectric layer having a top surface, a plurality of open-ended trenches extending within the dielectric layer, and interconnects comprising copper within the trenches, the interconnects having top surfaces that are substantially coplanar with the top surface of the dielectric layer. An exemplary structure is schematically illustrated in FIG. 3. A metal cap layer 62 is deposited on the structure and directly contacts the top surfaces of the interconnects 60 at a plurality of interfaces. The cap layer comprises at least one of titanium, ruthenium and cobalt. The structure is subjected to thermal annealing for a sufficient time and within a temperature range that causes metal alloy caps comprising copper and at least one of titanium, ruthenium and cobalt to be formed at the interfaces from the interconnects and a portion of the cap layer. A residual portion of the cap layer remains non-alloyed, as schematically illustrated in FIG. 5. The non-alloyed residual portion of the cap layer is removed from the structure to obtain the interconnect structure. FIG. 6 includes a schematic illustration of the resulting interconnect structure 70 wherein the alloy caps 64 are exposed following removal of the non-alloyed metal. The exemplary process leaves no residual metal on the dielectric regions between the capped interconnects. An interconnect structure 70 is accordingly provided that includes a dielectric layer 52 having a top surface, a plurality of open-ended trenches 56 extending within the dielectric layer, interconnects 60 comprising copper within the trenches, the interconnects having top surfaces that are substantially coplanar with the top surface of the dielectric layer, and a plurality of metal alloy caps 64 for preventing electromigration. Each of the alloy caps is integral with one of the interconnects and comprises an alloy of copper and at least one of titanium, ruthenium and cobalt.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FET devices and interconnect structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A fabrication method for integrating electrically conductive caps on interconnects, comprising:
   obtaining a structure including a dielectric layer having a top surface, a plurality of open-ended trenches extending within the dielectric layer, and interconnects comprising copper within the trenches, the interconnects having top surfaces that are substantially coplanar with the top surface of the dielectric layer;
   depositing a metal cap layer on the structure such that the metal cap layer directly contacts the top surfaces of the interconnects at a plurality of interfaces, the metal cap layer comprising at least one of titanium, ruthenium and cobalt;
   subjecting the structure to thermal annealing to form metal alloy caps comprising copper from the interconnects and at least one of titanium, ruthenium and cobalt at the interfaces from a portion of the metal cap layer while a residual portion of the metal cap layer remains non-alloyed, and
   selectively removing the non-alloyed residual portion of the metal cap layer from the structure;
   wherein the metal alloy caps exhibit a stoichiometry of at least one part titanium, ruthenium or cobalt per one part of copper.

2. The method of claim 1, wherein the interconnects consist essentially of copper.

3. The method of claim 2, wherein selectively removing the non-alloyed residual portion of the metal cap layer includes subjecting the structure to a wet etch.

4. The method of claim 3, wherein subjecting the structure to thermal annealing further includes maintaining an annealing temperature until the metal alloy caps have a thickness of at least three nanometers.

5. The method of claim 4, wherein subjecting the structure to thermal annealing further includes maintaining the annealing temperature until the metal alloy caps have a thickness of ten nanometers or less.

6. The method of claim 4, wherein the dielectric layer consists essentially of a dielectric material having a dielectric constant of less than three.

7. The method of claim 6, wherein obtaining the structure includes:
   forming the dielectric layer over a CMOS device layer including a semiconductor substrate.

8. The method of claim 7, wherein the structure further includes a barrier layer lining the trenches, the interconnects adjoining the barrier layer.

9. The method of claim 1, wherein depositing the metal cap layer includes depositing a metal layer selected from the group consisting essentially of titanium, ruthenium and cobalt and a metal nitride layer over the metal layer.

10. The method of claim 1, wherein the metal alloy caps consists essentially of copper and titanium.

11. The method of claim 1, wherein the dielectric layer consists essentially of a dielectric material having a dielectric constant of less than three, and further wherein selectively removing the non-alloyed residual portion of the metal cap layer includes subjecting the structure to a wet etch.

12. The method of claim 1, wherein subjecting the structure to thermal annealing further comprises employing one of a reducing ambient containing $Ar/H_2$ gas and a nitrogen-based ambient.

* * * * *